(12) United States Patent
Kienmayer et al.

(10) Patent No.: US 7,332,970 B2
(45) Date of Patent: Feb. 19, 2008

(54) INTEGRATED AMPLIFIER, ELECTRONIC COMMUNICATION UNIT WITH INTEGRATED AMPLIFIER AND METHOD FOR OPERATING THE ELECTRONIC COMMUNICATION UNIT WITH AN INTEGRATED AMPLIFIER

(75) Inventors: Christoph Kienmayer, Unterhaching (DE); Marc Tiebout, Munich (DE)

(73) Assignee: Infineon Technologies AG, Munich (DE)

( * ) Notice: Subject to any disclaimer, the term of this patent is extended or adjusted under 35 U.S.C. 154(b) by 69 days.

(21) Appl. No.: 11/080,341

(22) Filed: Mar. 15, 2005

(65) Prior Publication Data

US 2005/0231289 A1   Oct. 20, 2005

(30) Foreign Application Priority Data

Mar. 22, 2004   (DE) .................. 10 2004 013 953

(51) Int. Cl.
*H03F 3/195* (2006.01)
(52) U.S. Cl. .................................... 330/305
(58) Field of Classification Search ........... 330/305, 330/307; 327/122; 333/174
See application file for complete search history.

(56) References Cited

U.S. PATENT DOCUMENTS

| | | | | |
|---|---|---|---|---|
| 6,538,499 | B1 * | 3/2003 | Lu | 327/557 |
| 6,724,273 | B1 * | 4/2004 | Jones | 331/177 V |
| 6,864,728 | B1 * | 3/2005 | Lu | 327/122 |
| 2005/0190003 | A1 * | 9/2005 | Wu | 331/177 V |

FOREIGN PATENT DOCUMENTS

EP   0909018   4/1999

OTHER PUBLICATIONS

"A 2.7 Volt CMOS Broadband Low Noise Amplifier", J. Johansens et al., 1997 Symposium on VLSI Circuits Digest of Technical Papers, pp. 87-88.
"Broadband, 0.25 μm CMOS LNAs with Sub-2dB NF for GSM Applications", Q. Huang et al., IEEE 1998 Custom Integrated Circuits Conference, pp. 67-70.
"A 4.5—mW 900-MHz CMOS Receiver for Wireless Paging"; H. Darabi and A.A. Abidi; IEEE Journal of Solid State Circuits; vol. 35, No. 8 (Aug. 2000); pp. 1085-1096.

* cited by examiner

*Primary Examiner*—Robert Pascal
*Assistant Examiner*—Alan Wong
(74) *Attorney, Agent, or Firm*—Dicke, Billig & Czaja PLLC

(57) ABSTRACT

An integrated amplifier has a resonant circuit with a tuneable center frequency, in which the resonant circuit has at least one coil and at least one varactor for varying a resonant frequency of the resonant circuit.

12 Claims, 3 Drawing Sheets

INTEGRATED AMPLIFIER, ELECTRONIC COMMUNICATION UNIT WITH INTEGRATED AMPLIFIER AND METHOD FOR OPERATING THE ELECTRONIC COMMUNICATION UNIT WITH AN INTEGRATED AMPLIFIER

CROSS-REFERENCE TO RELATED APPLICATIONS

This Utility patent application claims priority to German Patent Application No. DE 10 2004 013 953.9-42, filed on Mar. 22, 2004, which is incorporated herein by reference.

FIELD OF THE INVENTION

The invention relates to an integrated amplifier, an electronic communication unit with integrated amplifier and a method for operating the electronic communication unit with an integrated amplifier.

BACKGROUND

All wire-free communication applications require so-called low noise amplifiers (LNA) in order to amplify the input signal as far as possible without additional noise. Since ever higher frequencies are used in wire-free communication applications, it becomes necessary to adapt the low noise amplifiers in such a way that they are suitable for said higher frequencies. Furthermore, the power loss of the low noise amplifiers or of an entire receiver in which a low noise amplifier is incorporated should be kept as small as possible. Typical examples of low noise amplifiers are disclosed.

In order still to achieve a sufficient gain of the low noise amplifiers even at high frequencies, coils are usually used in the design of circuit layouts. Coils that are provided for such applications generally have high quality factors, as a result of which it becomes possible to use the relevantly equipped low noise amplifiers. One disadvantage of using coils, however, is that they usually lead to a low available bandwidth of the receiver, that is to say that, when using coils, increasing the quality factor of the low noise amplifier is accompanied by a reduction of the bandwidth available for the use of the low noise amplifier. It can happen in this case that the bandwidth of the low noise amplifier does not suffice to process the bandwidths required for present-day wire-free communication applications.

One possibility for compensating for this disadvantage is to provide a plurality of capacitances in the circuit layout which are connected in parallel with the coil and together with the latter form a resonant circuit. Said capacitances are typically embodied as so-called metal to metal capacitances (MIMCaps). By using such capacitances in low noise amplifiers, it is possible to increase the bandwidth of the signals which can be processed by the low noise amplifiers, but by the same token the quality factor of the low noise amplifiers is reduced in this case.

One possibility for shifting the center frequency, i.e., the resonant frequency, of such a resonant circuit is to use switches, e.g., transistors, which are connected in series with the MIMCaps. The transistors make it possible for individual ones of the capacitances incorporated to be connected and disconnected, as a result of which the resonant frequency, i.e., the center frequency, of the resonant circuit is varied, i.e., the resonant circuit is detuned. Such a detuneable low noise amplifier is disclosed, by way of example.

For these and other reasons, there is a need for the present invention, including providing an integrated amplifier, an electronic communication unit with integrated amplifier and a method for operating the electronic communication unit with integrated amplifier, the integrated amplifier having a smaller space requirement, compared with the low noise amplifiers known in the prior art.

SUMMARY

The present invention provides an integrated amplifier, an electronic communication unit with integrated amplifier and a method for operating the electronic communication unit with integrated amplifier.

In one embodiment, an integrated amplifier according to the invention has a resonant circuit with a tuneable center frequency, the resonant circuit having at least one coil and at least one varactor for varying a resonant frequency of the resonant circuit.

An electronic communication unit has an integrated amplifier comprising a resonant circuit with a tuneable center frequency, the resonant circuit having at least one coil and a plurality of varactors for varying a resonant frequency of the resonant circuit, and an evaluation unit, the evaluation unit being set up in such a way that different combinations of the varactors are connected into the resonant circuit as capacitances by means of said evaluation unit when the integrated amplifier is switched on, and the evaluation circuit selects, on the basis of the resulting center frequencies, a combination of varactors which satisfies a predetermined criterion. Preferably, the predetermined criterion is a maximum permitted difference between the center frequency resulting from a respective varactor combination and a predetermined desired center frequency, i.e. that combination of varactors for which the resulting center frequency of the resonant circuit corresponds as far as possible precisely to the predetermined desired center frequency is clearly selected.

A method for operating an electronic communication unit having an integrated amplifier comprising a resonant circuit with a tuneable center frequency, the resonant circuit having at least one coil and a plurality of varactors for varying a resonant frequency of the resonant circuit, and an evaluation unit includes:

switching on the integrated amplifier;

through-connecting a plurality of possible combinations of varactors and determining the respectively resulting center frequency of the resonant circuit by means of the evaluation unit;

determining that resulting center frequency and the varactor combination corresponding thereto which satisfies a predetermined criterion, by means of the evaluation unit;

storing the varactor combination whose center frequency satisfies the predetermined criterion.

One aspect of the invention can be seen in varying a center frequency of a resonant circuit by means of at least one varactor. A capacitance according to the invention, i.e., a varactor, of a resonant circuit does not have any other circuit elements apart from a transistor, in particular it does not have any separately formed capacitances. Thus, a varactor formed by means of the transistor is solely used for forming the capacitance of a resonant circuit of an integrated amplifier. Instead of using a transistor as a varactor, the varactor may also be formed by means of a diode.

The integrated amplifier according to the invention has the advantage over an integrated amplifier in accordance with the prior art that it has a smaller space requirement since the separate capacitance connected in series with the transistor is obviated. As a result, switch and capacitance are combined in one component. The advantages are, inter alia, a very compact layout and the capability of using the integrated amplifier up to very high frequencies. Furthermore, the resulting quality factor of the resonant circuit and thus of the integrated amplifier is also very good. The varactors, i.e., the transistors, change their capacitance as a result of a signal, i.e., a voltage, being applied. The signals make it possible to switch the resonant circuit in discrete stages. The voltage is applied to the source/drain terminals of the varactors. The smaller space requirement is advantageous in particular since an ever higher level of integration, i.e., an ever greater miniaturization of the components, of an electronic circuit arrangement is striven for.

An exemplary electronic circuit arrangement for which an integrated amplifier according to the invention is suitable in particular is an electronic communication unit, for example a receiver of a wire-free communication device, e.g., a mobile phone.

In a method according to the invention for operating an electronic communication unit, e.g., a receiver of a wire-free communication device, possible combinations which can be formed by coupling a plurality of varactors are tried out one after the other. An evaluation unit can measure the resulting capacitances of the varactor combinations and compares the center frequencies of the resonant circuit that result from the individual varactor combinations with a predetermined desired center frequency. The evaluation unit chooses the best varactor combination by determining for example the respective difference between the center frequency resulting for each varactor combination and the desired center frequency. The measurement and evaluation are preferably performed once when the receiver is turned on and the best varactor combination obtained during operation of the receiver is stored. After the receiver has been switched off and turned on anew, the determination of the best varactor combination is preferably carried out again, so that a possible variation of the varactors or of the resonant circuit with time or a changed desired center frequency can be taken into account. It has been found that it is not necessary to continually determine the best varactor combination during operation of the receiver, since the center frequency of the varactor combinations are stable overtime during operation, i.e., they are not subject for example to pronounced drift with changing temperature during operation of the receiver. The evaluation unit may be formed for example as a processor with corresponding software.

The further refinements of the invention relate to the integrated amplifier, the electronic communication unit and the method for operating an electronic communication unit with an integrated amplifier.

The at least one varactor may be formed by means of a transistor block comprising at least one transistor.

The resonant circuit preferably has a plurality of varactors, each varactor being formed by means of a transistor block.

The use of a plurality of varactors in the resonant circuit of the integrated amplifier makes it possible, in a simple manner, to subsequently track a center frequency of the resonant circuit and thus of the entire amplifier by simply determining, by means of varactors, the best suited combination of varactors, i.e. the combination of varactors which produce a center frequency that best corresponds to a desired center frequency of the integrated amplifier. It is furthermore possible to achieve high quality factors at the output of the amplifier. A high gain thus results in a simple manner even at high frequencies and it is possible to set the center frequency by means of switching of the varactors.

The plurality of varactors are particularly preferably connected in parallel with one another.

Connecting the individual varactors in parallel is particularly preferred since, in the case of a parallel circuit formed by the individual varactors, i.e., the transistor blocks, the individual varactors can be switched in a simple manner and it is thus possible to determine the best suited combination of varactors which best produces a desired center frequency of the integrated amplifier.

In one development, each varactor comprises a transistor block. This clearly means that each varactor has only transistors and no other active electronic components, in particular no additional capacitances. Only the capacitances of each individual transistor are used as capacitances of the varactors. By means of a voltage signal that is in each case applied to the source/drain terminals of the transistors, it is possible to change the capacitance of the individual transistor, thereby affording the functionality of a varactor. A particularly compact layout of the circuit is thus made possible.

In one development, the integrated amplifier is formed as a differential integrated amplifier, i.e., as an integrated amplifier to which two input signals to be amplified are fed, which input signals have a phase shift with respect to one another. In that case, each transistor block preferably has precisely two transistors.

Forming the integrated amplifier as a differential integrated amplifier has the advantage that differential signals, which are often used in electronic communication units, can be amplified in a simple manner by means of this configuration.

The integrated amplifier is preferably set up in such a way that the center frequency of the integrated amplifier can be detuned by applying signals to the source/drain terminals of the at least one transistor of the transistor block.

In one preferred refinement, the transistor/transistors of the transistor block/transistor blocks are MOS transistors.

The use of MOS transistors as transistors of the transistor blocks is a particularly suitable configuration of the varactors since, in the case of MOS transistors, the capacitance can be controlled in a simple manner by means of a control signal applied to the source/drain terminals of the MOS transistors. The MOS transistors may be formed as PMOS and/or NMOS transistors. Furthermore, the transistors may also be formed as PMOS transistors in a p-type well, i.e., as so-called PCAP, and/or as NMOS transistors in an n-type well, i.e., as so-called NCAP. PCAP and NCAP are also referred to as accumulation mode varactors.

In one development, the transistors of the transistor blocks are set up in such a way that a control signal can be applied to the source/drain terminals for the purpose of varying the capacitance of the varactor/varactors.

The capacitance of the transistors of the transistor blocks can be controlled by means of the control signal that can be applied to the source/drain terminals. Consequently, a controllable capacitance, i.e., a varactor, is realized in a simple manner.

The integrated amplifier preferably has an additional resonant circuit with at least one additional coil and at least one additional varactor. Particularly preferably, the resonant circuit and the additional resonant circuit are structurally identical, i.e., the coil and the varactor of the resonant circuit and the coil and the varactor, respectively, of the additional resonant circuit are formed in structurally identical fashion.

Such a double design of resonant circuits of an integrated amplifier increases the symmetry of the circuit of the integrated amplifier, thus resulting in an improved performance characteristic of the integrated amplifier.

To summarize, one aspect of the invention can be seen in the fact that a resonant circuit of an integrated amplifier has a plurality of varactors connected in parallel, the varactors solely being formed by means of transistors, i.e., the varactors not having any separate capacitances. The transistors are formed by means of MOS transistors, thereby making it possible to track the center frequency of the resonant circuit and thus of the integrated amplifier by applying control signals, i.e., voltage, to the source/drain terminals of the transistors of the varactors. According to the invention, the integrated amplifier may be formed both as a simple integrated amplifier and as an integrated differential amplifier, i.e., as an integrated amplifier to which two input signals to be amplified are fed, which input signals have a phase shift with respect to one another. The phase shift of the two input signals to be amplified is preferably 180°. However, it is also possible to realize a different phase shift, for example 90° or 270°.

When such an integrated amplifier is used within a receiver, it is particularly advantageous if, each time the receiver is switched on, to put it clearly, different combinations of varactors are tried out, the center frequency of the resonant circuit that results for each combination is determined and that varactor combination is determined which best matches a predetermined desired center frequency, i.e., has the smallest difference between the resulting center frequency and the predetermined desired center frequency.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

A description is given below, referring to FIG. 1, of a circuit arrangement of an integrated amplifier in accordance with a first exemplary embodiment of the invention.

Figure 1:
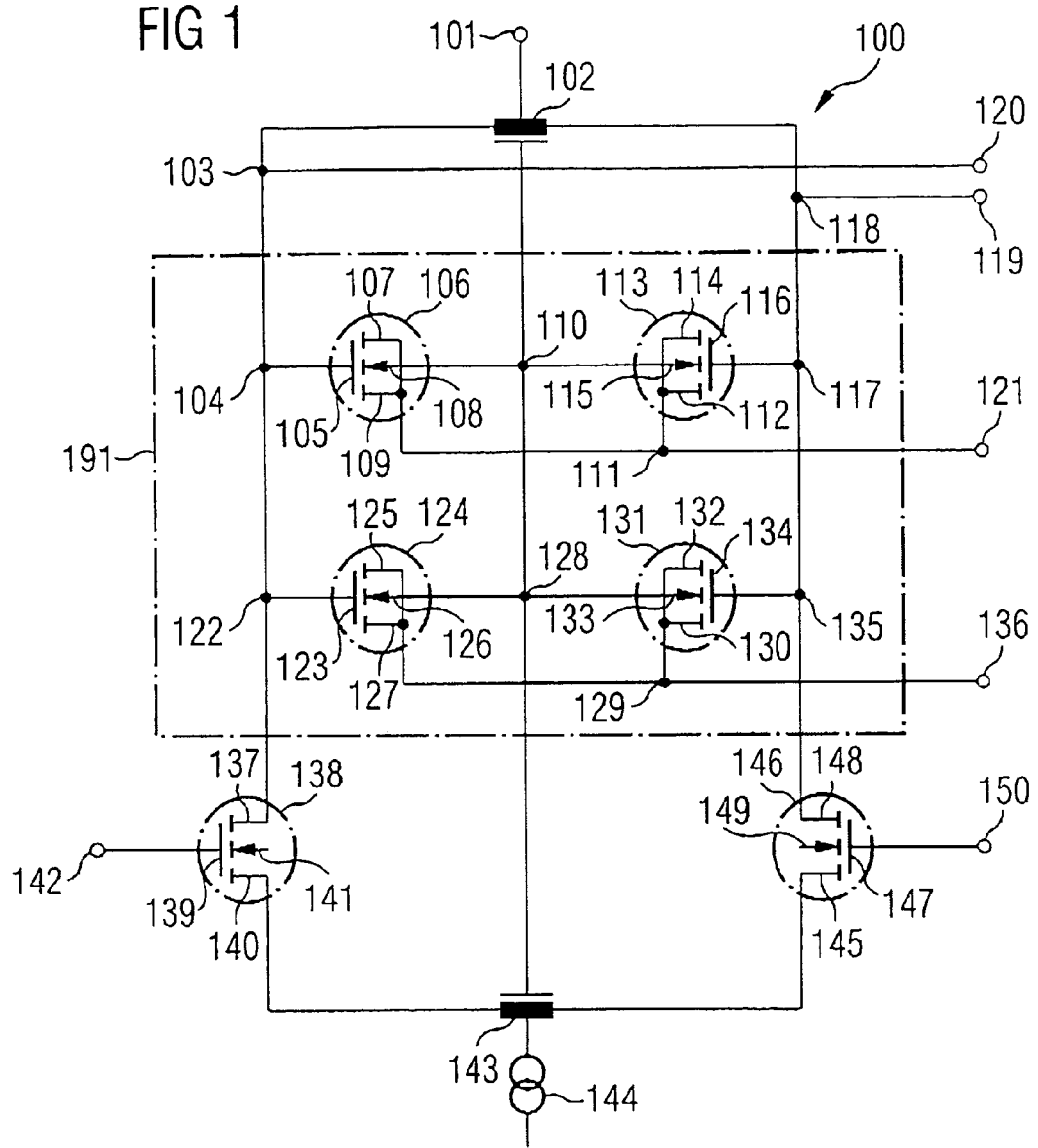
FIG. 1 illustrates a schematic illustration of a circuit arrangement of an integrated amplifier in accordance with a first exemplary embodiment of the invention.

FIG. 1 schematically illustrates an integrated amplifier 100. The amplifier 100 has a supply voltage source 101. The supply voltage source 101 is coupled to a first inductance 102. In FIG. 1, the first inductance 102 has a center tap, to which the supply voltage source 101 is coupled. The inductance 102 may also be designed in the form of two series-connected individual inductances, the supply voltage source 101 then preferably being coupled in between the two individual inductances.

A first terminal of the inductance 102 is coupled to a first node 103. The first node 103 is coupled to a second node 104. The second node 104 is coupled to a gate terminal 105 of a first transistor 106. A first source/drain terminal 107 of the first transistor 106 is coupled to a second source/drain terminal 109 of the first transistor 106. A bulk terminal 108 of the first transistor 106 is coupled to a third node 110. The second source/drain terminal 109 of the first transistor 106 is coupled to a fourth node 111.

The fourth node 111 is coupled to a first source/drain terminal 112 of a second transistor 113. Furthermore, the fourth node 111 is coupled to a first control signal input terminal 121. A second source/drain terminal 114 of the second transistor 113 is coupled to the first source/drain terminal 112 of the second transistor 113. A bulk terminal 115 of the second transistor 113 is coupled to the third node 110. A gate terminal 116 of the second transistor 113 is coupled to a fifth node 117.

The fifth node 117 is coupled to a sixth node 118. The sixth node 118 is coupled to a first output terminal 119 of the amplifier 100. Furthermore, the sixth node 118 is coupled to a second terminal of the first inductance 102. A second output terminal 120 of the amplifier 100 is coupled to the first node 103.

The second node 104 is furthermore coupled to a seventh node 122. The seventh node 122 is coupled to a gate terminal 123 of a third transistor 124. A first source/drain terminal 125 of the third transistor 124 is coupled to a second source/drain terminal 127 of the third transistor 124. A bulk terminal 126 of the third transistor 124 is coupled to an eight node 128. The second source/drain terminal 127 of the third transistor is coupled to a ninth node 129.

The ninth node 129 is coupled to a first source/drain terminal 130 of a fourth transistor 131. Furthermore, the ninth node 129 is coupled to a second control signal input terminal 136. A second source/drain terminal 132 of the fourth transistor 131 is coupled to the first source/drain terminal 130 of the fourth transistor 131. A bulk terminal 133 of the fourth transistor 131 is coupled to the eighth node 128. A gate terminal 134 of the fourth transistor 131 is coupled to a tenth node 135. The tenth node 135 is coupled to the fifth node 117.

The previously described components of the integrated amplifier 100 form the resonant circuit 191 and the input and output terminals thereof, the first transistor 106 and the second transistor 113, and the third transistor 124 and the fourth transistor 131, in each case forming a transistor block and together forming the capacitance of the resonant circuit 191.

The seventh node 122 is coupled to a first source/drain terminal 137 of a fifth transistor 138. A gate terminal 139 of the fifth transistor 138 is coupled to a first input terminal 142. A second source/drain terminal 140 of the fifth transistor 138 is coupled to a first terminal of a second inductance 143. A bulk terminal 141 of the fifth transistor 138 can be grounded. In FIG. 1, the second inductance 143 has a center tap, to which a current source 144 is coupled. The inductance 143 may also be designed in the form of two series-connected individual inductances, the supply voltage source 144 then preferably being coupled in between the two individual inductances.

A second terminal of the second inductance 143 is coupled to a first source/drain terminal 145 of a sixth transistor 146. A gate terminal 147 of the sixth transistor 146 is coupled to a second input terminal 150. A second source/drain terminal 148 of the sixth transistor 146 is coupled to the tenth node 135. A bulk terminal 149 of the sixth transistor 146 can be grounded.

Furthermore, the third node 110, the eighth node 128, and a shielding and/or a parasitic substrate layer of the first inductance 102 and of the second inductance 143 are coupled to one another and grounded.

In FIG. 1, all of the transistors illustrated are formed as NMOS transistors. However, the transistors may also be formed as PMOS transistors according to the invention. In the case where the transistors are formed as PMOS transistors, the bulk terminal of the first transistor 106, of the second transistor 113, of the third transistor 124 and of the fourth transistor 131, i.e., of the transistors of the resonant circuit 191 which form the varactors, may also be short-circuited with the source/drain terminals of the respective transistors, while the bulk terminals in the case of the NMOS transistors, as described, are connected to ground potential. Furthermore, the transistors may also be formed as PMOS transistors in a p-type well, i.e., as so-called PCAP and/or as NMOS transistors in an n-type well, i.e., as so-called NCAP. PCAP and NCAP are also referred to as accumulation mode varactors.

The exemplary embodiment in accordance with FIG. 1 shows a preferred embodiment of an integrated differential amplifier, i.e., of an integrated amplifier to which two input signals are fed, which input signals have a phase shift with respect to one another, which is generally 180°. The two input signals which are to be amplified are fed to the amplifier described in connection with FIG. 1 via the first input terminal 142 and the second input terminal 150.

The amplified differential output signals can be tapped off at the first output terminal 119 and the second output terminal 120. The integrated amplifier 100 additionally has two control signal input terminals 121 and 136, by means of which the transistors 106, 113, 124 and 131 of the resonant circuit, which form the transistor blocks of the varactors, can be switched. Consequently, the capacitance of the resonant circuit and thus the center frequency of the integrated amplifier 100 can be switched by means of control signals that are applied to the control signal input terminals 121 and 136.

According to the invention, the number of varactors, i.e., transistor blocks, is not restricted to two, rather it is possible to provide a plurality of transistor blocks, i.e., varactors, within the integrated amplifier, the circuit being adapted in such a way that a control signal can be fed to each varactor. By way of example, the number of control signal input terminals is in each case adapted to the number of varactors provided within the integrated amplifier.

If an electronic communication unit having an integrated amplifier according to the invention with a plurality of varactors is switched on, then, in an initialisation phase, in a manually controlled and/or computer-controlled manner, by means of a measuring/evaluation unit, e.g., a processor, the control signal input terminals of the integrated amplifier are supplied with different signals that have the effect of varying the capacitance of the individual varactors, thus the capacitance of the resonant circuit and thus the center frequency of the integrated amplifier. The measuring/evaluation unit goes systematically through the different capacitances of the resonant circuit which can be realized by means of different control signals at the control signal input terminals and determines that capacitance and thus that combination of control signal input signals which best matches a predetermined desired center frequency. This combination is stored and then used during operation of the electronic communication unit in order to best match the center frequency of the integrated amplifier to the desired center frequency. During operation of the electronic communication unit, it is generally not necessary to carry out a second initialisation, i.e., a second determination of the best combination of control signal input signals, since the integrated amplifier is sufficiently stable with respect to variations, e.g., temperature variations. However, the initialisation phase described is preferably carried out anew each time the electronic communication unit is switched on. An arrangement for carrying out an initialisation phase will also be briefly explained below with reference to FIG. 3.

A second exemplary embodiment of an integrated amplifier according to the invention is described below with reference to FIG. 2.

Figure 2:
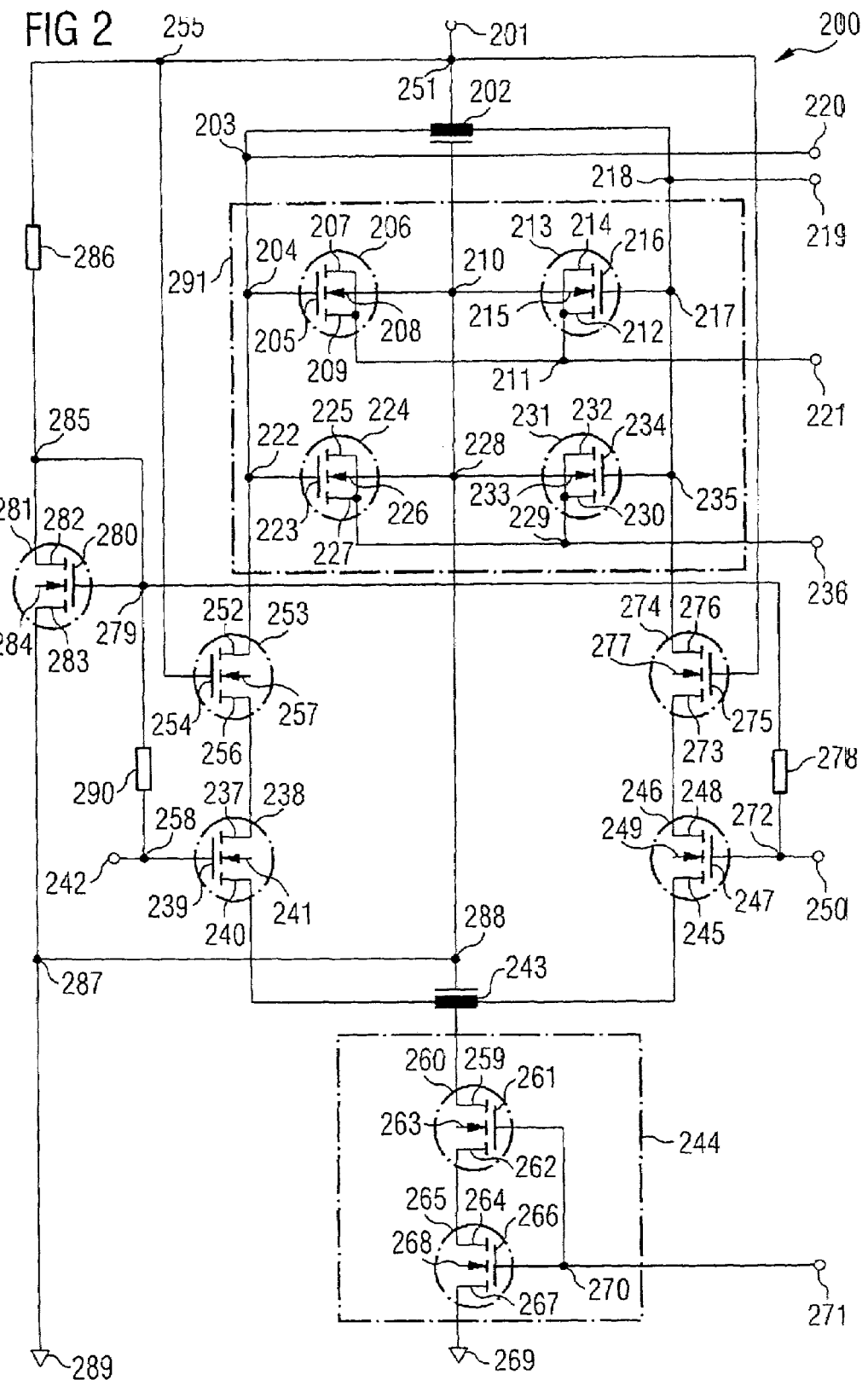
FIG. 2 illustrates a schematic illustration of a circuit arrangement of an integrated amplifier in accordance with a second exemplary embodiment of the invention.

FIG. 2 schematically illustrates an integrated amplifier 200. The amplifier 200 has a supply voltage source 201. The supply voltage source 201 is coupled to an eleventh node 251. The eleventh node 251 is coupled to a first inductance 202. In FIG. 2, the first inductance 202 has a center tap, to which the eleventh node 251 is coupled. The inductance 202 may also be designed in the form of two series-connected individual inductances, the eleventh node 251 and thus the supply voltage source 201 then preferably being coupled in between the two individual inductances.

A first terminal of the inductance 202 is coupled to a first node 203. The first node 203 is coupled to a second node 204. The second node 204 is coupled to a gate terminal 205 of a first transistor 206. A first source/drain terminal 207 of the first transistor 206 is coupled to a second source/drain terminal 209 of the first transistor 206. A bulk terminal 208 of the first transistor 206 is coupled to a third node 210. The second source/drain terminal 209 of the first transistor 206 is coupled to a fourth node 211.

The fourth node 211 is coupled to a first source/drain terminal 212 of a second transistor 213. Furthermore, the fourth node 211 is coupled to a first control signal input terminal 221. A second source/drain terminal 214 of the second transistor 213 is coupled to the first source/drain terminal 212 of the second transistor 213. A bulk terminal 215 of the second transistor 213 is coupled to the third node 210. A gate terminal 216 of the second transistor 213 is coupled to a fifth node 217.

The fifth node 217 is coupled to a sixth node 218. The sixth node 218 is coupled to a first output terminal 219 of the amplifier 200. Furthermore, the sixth node 218 is coupled to a second terminal of the first inductance 202. A second output terminal 220 of the amplifier 200 is coupled to the first node 213.

The second node 204 is furthermore coupled to a seventh node 202. The seventh node 202 is coupled to a gate terminal 223 of a third transistor 224. A first source/drain terminal 225 of the third transistor 224 is coupled to a second source/drain terminal 227 of the third transistor 224. A bulk terminal 226 of the third transistor 224 is coupled to an eighth node 228. The second source/drain terminal 227 of the third transistor 224 is coupled to a ninth node 229.

The ninth node 229 is coupled to a first source/drain terminal 230 of a fourth transistor 231. Furthermore, the ninth node 229 is coupled to a second control signal input terminal 236. A second source/drain terminal 232 of the fourth transistor 231 is coupled to the first source/drain terminal 230 of the fourth transistor 231. A bulk terminal 233 of the fourth transistor 231 is coupled to the eighth node 228. A gate terminal 234 of the fourth transistor 231 is coupled to a tenth node 235. The tenth node 235 is coupled to the fifth node 217.

The previously described components of the integrated amplifier 200 form the resonant circuit 291 and the input and output terminals thereof, the first transistor 206 and the second transistor 213, and the third transistor 224 and the fourth transistor 231, in each case forming a transistor block.

The seventh node 222 is furthermore coupled to a first source/drain terminal 252 of a seventh transistor 253. A gate terminal 254 of the seventh transistor 253 is coupled to a twelfth node 255. The twelfth node 255 is coupled to the eleventh node 251. A second source/drain terminal 256 of the seventh transistor 253 is coupled to a first source/drain terminal 237 of a fifth transistors 238. A bulk terminal 257 of the seventh transistor 253 can be grounded.

A gate terminal 239 of the fifth transistor 238 is coupled to a thirteenth node 258. The thirteenth node 258 is coupled to a first input terminal 242. A second source/drain terminal 240 of the fifth transistor 238 is coupled to a first terminal of a second inductance 243. A bulk terminal 241 of the fifth transistor 238 can be grounded. In FIG. 1, the inductance 243 has a center tap, to which a current source 244 is coupled. The inductance 243 may also be designed in the form of two series-connected individual inductances, the supply voltage source 244 then preferably being coupled in between the two individual inductances.

A configuration of the current source 244 is illustrated in a more detailed fashion in the exemplary embodiment of FIG. 2. The current source 244 has an eighth transistor 260. A first source/drain terminal 259 of the eighth transistor 260 is coupled to the center tap of the second inductance 243. A bulk terminal 263 of the eighth transistor 260 can be grounded. A second source/drain terminal 262 of the eighth transistor 260 is coupled to a first source/drain terminal 264 of a ninth transistor 265. A gate terminal 266 of the ninth transistor 265 is coupled to a fourteenth node 270. A second source/drain terminal 267 of the ninth transistor 265 is coupled to a ground terminal 269. A gate terminal 261 of the eighth transistor 260 is likewise coupled to the fourteenth node 270. Furthermore, the fourteenth node 270 is coupled to a voltage source terminal 271. A bulk terminal 268 of the ninth transistor 265 can be grounded. The electronic components described in this section constitute one possible form of the configuration of a current source 244 for the integrated amplifier 200.

A second terminal of the second inductance 243 is coupled to a first source/drain terminal 245 of a sixth transistor 246. A gate terminal 247 of the sixth transistor 246 is coupled to a fifteenth node 272. The fifteenth node 272 is coupled to a second input terminal 250. A second source/drain terminal 248 of the sixth transistor 246 is coupled to a first source/drain terminal 273 of a tenth transistor 274. A bulk terminal 249 of the sixth transistor 246 can be grounded. A gate terminal 275 of the tenth transistor 274 is coupled to the eleventh node 251. A second source/drain terminal 276 of the tenth transistor 274 is coupled to the tenth node 235. A bulk terminal 277 of the tenth transistor 274 can be grounded.

The fifteenth node 277 is coupled to a first terminal of a resistor 278, the second terminal of which is coupled to a sixteenth node 279. The sixteenth node 279 is coupled to the thirteenth node 258 via a third resistor 290. Furthermore, the sixteenth node 279 is coupled to a gate terminal 280 of an eleventh transistor 281. A first source/drain terminal 282 of the eleventh transistor 281 is coupled to a seventeenth node 285. The seventeenth node 285 is coupled, on the one hand, via a second resistor 286 to the twelfth node 255 and coupled, on the other hand, to the sixteenth node 279. A second source/drain terminal 283 of the eleventh transistor 281 is coupled to an eighteenth node 287. A bulk terminal 284 of the eleventh transistor 281 can be grounded. The eighteenth node 287 is coupled to a nineteenth node 288, which is coupled to the eighth node 228. Furthermore, the eighteenth node 287 is coupled to a ground terminal 289.

Furthermore, the third node 210, the eighth node 228, the nineteenth node 288 and a shielding and/or a parasitic substrate layer of the first inductance 202 and of the second inductance 243 are coupled to one another and grounded.

The electronic components described which have not been described as associated with the resonant circuit 291 or with the current source 244, i.e., in particular the fifth transistor 238, the sixth transistor 246, the seventh transistor 253, the tenth transistor 274, and their interconnection among one another form a so-called cascode circuit.

The exemplary embodiment in accordance with FIG. 2 illustrates a preferred embodiment of an integrated differential amplifier, i.e., of an integrated amplifier to which two input signals are fed, which input signals have a phase shift with respect to one another, which is generally 180°. The two input signals which are to be amplified are fed to the amplifier described in connection with FIG. 2 via the first input terminal 242 and the second input terminal 230.

The amplified differential output signals can be tapped off at the first output terminal 219 and the second output terminal 220. The integrated amplifier 200 additionally has two control signal input terminals 221 and 236, by means of which the transistors 206, 213, 224 and 231 of the resonant circuit, which form the transistor blocks of the varactors, can be fed with control signals and can thus be switched. Consequently, the capacitance of the resonant circuit and thus the center frequency of the integrated amplifier 200 can be switched by means of control signals that are applied to the control signal input terminals 221 and 236.

According to the invention, the number of varactors, i.e., transistor blocks, is not restricted to two, rather it is possible to provide a plurality of transistor blocks, i.e., varactors, within the integrated amplifier, the circuit being adapted in such a way that a control signal can be fed to each varactor. By way of example, the number of control signal input terminals is in each case adapted to the number of varactors provided within the integrated amplifier, i.e., a dedicated signal input terminal is in each case provided for each varactor, each varactor having a plurality of transistors, preferably two transistors in the case of a differential integrated amplifier.

If an electronic communication unit having an integrated amplifier according to the invention with a plurality of varactors is switched on, then an identical initialisation process to that described with reference to FIG. 1 is preferably carried out.

Figure 3:
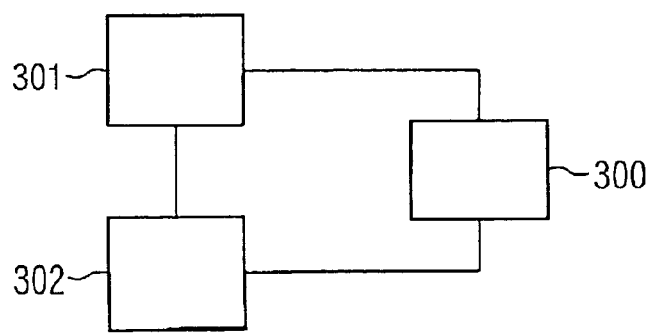
FIG. 3 illustrates a schematic illustration of an arrangement for carrying out an initialisation phase.

FIG. 3 illustrates a schematic illustration for an arrangement for carrying out an initialisation process. An arrangement for carrying out an initialisation process has an integrated amplifier 300. The integrated amplifier 300 is supplied with control signals by means of a processor or computer 301, by means of which control signals, in a manually controlled and/or computer-controlled manner, different combinations of varactors of the integrated amplifier 300 are switched. The capacitances and thus center frequencies of the resonant circuit of the integrated amplifier 300 which result from these different combinations of varactors are measured by means of a measuring unit 302. The capacitances and/or center frequencies measured for the respective combination of varactors are communicated to the processor 301 by the measuring unit 302. The processor 301 evaluates the measured center frequencies by comparing them with a predetermined desired center frequency. Furthermore, the processor 301 can also determine and store that combination of varactors whose resulting and measured center frequency has the least difference with respect to the predetermined center frequency.

The processor 301 and the measuring unit 302 do not have to be embodied as separate units, but rather may also be provided as an individual processor, the individual processor preferably being provided in the electronic communication unit.

Figure 4:
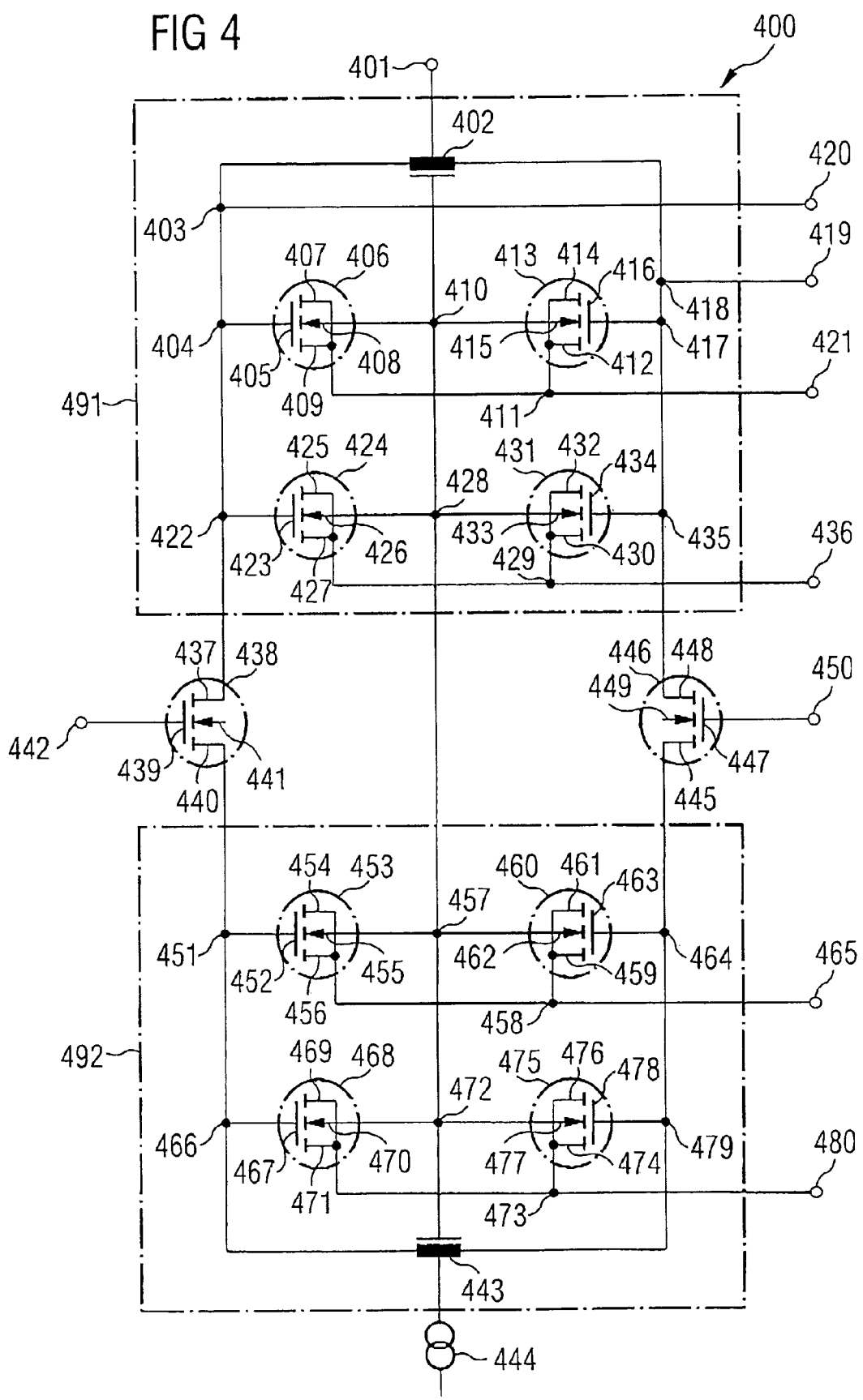
FIG. 4 illustrates a schematic illustration of a circuit arrangement of an integrated amplifier in accordance with a third exemplary embodiment of the invention.

FIG. 4 schematically illustrates an integrated amplifier 400 in accordance with a preferred exemplary embodiment.

The amplifier 400 has a supply voltage source 401. The supply voltage source 401 is coupled to a first inductance 402. In FIG. 4, the first inductance 402 has a center tap, to which the supply voltage source 401 is coupled. The inductance 402 may also be designed in the form of two series-connected individual inductances, the supply voltage source 401 then preferably being coupled in between the two individual inductances.

A first terminal of the inductance 402 is coupled to a first node 403. The first node 403 is coupled to a second node 404. The second node 404 is coupled to a gate terminal 405 of a first transistor 406. A first source/drain terminal 407 of the first transistor 406 is coupled to a second source/drain terminal 409 of the first transistor 406. A bulk terminal 408 of the first transistor 406 is coupled to a third node 410. The second source/drain terminal 409 of the first transistor 406 is coupled to a fourth node 411.

The fourth node 411 is coupled to a first source/drain terminal 412 of a second transistor 413. Furthermore, the fourth node 411 is coupled to a first control signal input terminal 421. A second source/drain terminal 414 of the second transistor 413 is coupled to the first source/drain terminal 412 of the second transistor 413. A bulk terminal 415 of the second transistor 413 is coupled to the third node 410. A gate terminal 416 of the second transistor 413 is coupled to a fifth node 417.

The fifth node 417 is coupled to a sixth node 418. The sixth node 418 is coupled to a first output terminal 419 of the amplifier 400. Furthermore, the sixth node 418 is coupled to a second terminal of the first inductance 402. A second output terminal 420 of the amplifier 400 is coupled to the first node 403.

The second node 404 is furthermore coupled to a seventh node 422. The seventh node 422 is coupled to a gate terminal 423 of a third transistor 424. A first source/drain terminal 425 of the third transistor 424 is coupled to a second source/drain terminal 427 of the third transistor 424. A bulk terminal 426 of the third transistor 424 is coupled to an eighth node 428. The second source/drain terminal 427 of the third transistor 424 is coupled to a ninth node 429.

The ninth node 429 is coupled to a first source/drain terminal 430 of a fourth transistor 431. Furthermore, the ninth node 429 is coupled to a second control signal input terminal 436. A second source/drain terminal 432 of the fourth transistor 431 is coupled to the first source/drain terminal 430 of the fourth transistor 431. A bulk terminal 433 of the fourth transistor 431 is coupled to the eighth node 428. A gate terminal 434 of the fourth transistor 431 is coupled to a tenth node 435. The tenth node 435 is coupled to the fifth node 417.

The previously described components of the integrated amplifier 400 form the resonant circuit 491 and the input and output terminals thereof, the first transistor 406 and the second transistor 413, and the third transistor 424 and the fourth transistor 431, in each case forming a transistor block and together forming the capacitance of the resonant circuit 491.

The seventh node 422 is coupled to a first source/drain terminal 437 of a fifth transistor 438. A gate terminal 439 of the fifth transistor 438 is coupled to a first input terminal 442. A second source/drain terminal 440 of the fifth transistor 438 is coupled to an eleventh node 451. A bulk terminal 441 of the fifth transistor 438 can be grounded. The eleventh node 451 is coupled to a gate terminal 452 of a seventh transistor 453. A first source/drain terminal 454 of the seventh transistor 453 is coupled to a second source/drain terminal 456 of the seventh transistor 453. A bulk terminal 455 of the seventh transistor 453 is coupled to a twelfth node 457. The second source/drain terminal 456 of the seventh transistor 453 is coupled to a thirteenth node 458.

The thirteenth node 458 is coupled to a first source/drain terminal 459 of an eighth transistor 460. Furthermore, the thirteenth node 458 is coupled to a third control signal input terminal 465. A second source/drain terminal 461 of the eighth transistor 463 is coupled to the first source/drain terminal 459 of the eighth transistor 460. A bulk terminal 462 of the eighth transistor 460 is coupled to the twelfth node 457. A gate terminal 463 of the eighth transistor 460 is coupled to a fourteenth node 464. The fourteenth node 464 is coupled to a first source/drain terminal 445 of a sixth transistor 446. A gate terminal 447 of the sixth transistor 446 is coupled to a second input terminal 450. A second source/drain terminal 448 of the sixth transistor 446 is coupled to the tenth node 435. A bulk terminal 449 of the sixth transistor 446 can be grounded.

The eleventh node 451 is furthermore coupled to a fifteenth node 466. The fifteenth node 466 is coupled to a gate terminal 467 of a ninth transistor 468. A first source/drain terminal 469 of the ninth transistor 468 is coupled to a second source/drain terminal 471 of the ninth transistor 468. A bulk terminal 470 of the ninth transistor 468 is coupled to a sixteenth node 472. The second source/drain terminal 471 of the ninth transistor 468 is coupled to a seventeenth node 473.

The seventeenth node 473 is coupled to a first source/drain terminal 474 of a tenth transistor 475. Furthermore, the seventeenth node 473 is coupled to a fourth control signal input terminal 480. A second source/drain terminal 476 of the tenth transistor 475 is coupled to the first source/drain terminal 474 of the tenth transistor 475. A bulk terminal 477 of the tenth transistor 475 is coupled to the sixteenth node 472. A gate terminal 478 of the tenth transistor 475 is coupled to an eighteenth node 479. The eighteenth node 479 is coupled to the fourteenth node 464.

The fifteenth node 466 is furthermore coupled to a first terminal of a second inductance 443. In FIG. 4, the second inductance 443 has a center tap, to which a current source 444 is coupled. The inductance 443 may also be designed in the form of two series-connected individual inductances, the supply voltage source 444 then preferably being coupled in between the two individual inductances.

Furthermore, the third node 410, the eighth node 428, the twelfth node 457, the sixteenth node 472 and a shielding and/or a parasitic substrate layer of the first inductance 402 and of the second inductance 443 are coupled to one another and grounded.

Clearly, the second inductance 443, the seventh transistor 453, the eighth transistor 460, the ninth transistor 468 and the tenth transistor 475 form a second resonant circuit. In this case, the seventh transistor 453 and the eighth transistor 460, and the ninth transistor 468 and the tenth transistor 475, in each case form a transistor block, which together form the capacitance of the second resonant circuit 492.

The exemplary embodiment illustrated in FIG. 4 is very similar to the exemplary embodiment illustrated schematically in FIG. 1. However, in the exemplary embodiment of FIG. 4, an additional capacitance formed in an identical way to the above-described capacitance, i.e., the first transistor 106, the second transistor 113, the third transistor 124 and the fourth transistor 131, of the resonant circuit 191 is formed in a manner associated with the second inductance 143 of FIG. 1. This improves the symmetry of the circuit, i.e., of the integrated amplifier 400, and thus also the performance of the integrated amplifier 400 compared with the integrated amplifier 100 illustrated schematically in FIG. 1. To summarize, the invention provides an integrated amplifier which is improved compared with the prior art. An integrated amplifier according to the invention has a resonant circuit with at least one varactor, which is formed by means of a transistor block, i.e., the varactor does not have any special capacitances, rather the capacitance of the transistor, which is preferably a MOS transistor, is utilized. The space requirement of the integrated amplifier according to the invention is thereby reduced. The capacitance of the MOS transistors can be varied by applying a control signal, i.e., a voltage signal, to the source/drain terminals. This makes it possible for the center frequency of the resonant circuit of the integrated amplifier and thus the center frequency of an electronic communication unit into which the integrated amplifier is incorporated to be subsequently controlled and tuned to a desired center frequency. This is possible in particular when a plurality of varactors, i.e., MOS transistors, are used. When a plurality of varactors are used, it is possible to compensate for differences in the individual MOS transistors and/or the other electronic components used, which differences lead to a variation of the center frequency of the integrated amplifier. This enables a better and subsequent adjustment, i.e., after the individual parts have been assembled to form an integrated amplifier, of the center frequency of the integrated amplifier with a predetermined desired center frequency.

The invention claimed is:

1. An integrated amplifier comprising:
a resonant circuit with a tunable center frequency, the resonant circuit having at least one coil and a plurality of varactors connected in parallel with one another for varying a resonant frequency of the resonant circuit, wherein each one of the plurality of varactors is formed by a transistor block having at least one transistor, the transistor block providing substantially all capacitance for the resonant circuit.

2. The integrated amplifier of claim 1, wherein the integrated amplifier is formed as a differential integrated amplifier.

3. The integrated amplifier of claim 1, wherein the center frequency of the integrated amplifier is detuned by applying signals to the source/drain terminals of the at least one transistor of the transistor block.

4. The integrated amplifier of claim 1, wherein the transistor/transistors of the transistor block/transistor blocks are MOS transistors.

5. An integrated amplifier, comprising:
a resonant circuit with a tunable center frequency, the resonant circuit having at least one coil and a plurality of varactors connected in parallel with one another for varying a resonant frequency of the resonant circuit, wherein each one of the plurality of varactors is formed by a transistor block having at least one transistor, the transistor block providing substantially all capacitance for the resonant circuit; and
an additional resonant circuit with at least one additional coil and at least one additional varactor.

6. The integrated amplifier of claim 5, wherein the integrated amplifier is formed as a differential integrated amplifier.

7. The integrated amplifier of claim 6, wherein the center frequency of the integrated amplifier is detuned by applying signals to the source/drain terminals of the at least one transistor of the transistor block.

8. The integrated amplifier of claim 7, wherein each transistor is a MOS transistor.

9. An electronic communication unit having an integrated amplifier comprising:
a resonant circuit with a tunable center frequency, the resonant circuit having at least one coil and a plurality of varactors connected in parallel with one another for varying a resonant frequency of the resonant circuit and for providing substantially all capacitance for the resonant circuit; and
an evaluation unit, the evaluation unit being configured such that different combinations of the varactors are connected into the resonant circuit as capacitances by the evaluation unit when the integrated amplifier is switched on, and the evaluation unit selects, from the resulting center frequencies, one combination of varactors which satisfies a predetermined criterion.

10. The electronic communication unit of claim 9, wherein the predetermined criterion is a difference between the resulting center frequency and a predetermined desired center frequency.

11. A method for operating an electronic communication unit comprising:
defining an integrated amplifier comprising a resonant circuit with a tunable center frequency, the resonant circuit having at least one coil and a plurality of varactors connected in parallel with one another for varying a resonant frequency of the resonant circuit and for providing substantially all capacitance for the resonant circuit, and an evaluation unit;
switching on the integrated amplifier;
through-connecting a plurality of possible combinations of varactors and determining the respectively resulting center frequency of the resonant circuit by means of the evaluation unit;
determining that resulting center frequency and the varactor combination corresponding thereto which satisfies a predetermined criterion, by means of the evaluation unit; and
storing the varactor combination whose center frequency satisfies the predetermined criterion until the amplifier is switched off.

12. The method of claim 11, comprising:
detuning the center frequency of the integrated amplifier by applying signals to the source/drain terminals of at least one transistor of a transistor block.

* * * * *

UNITED STATES PATENT AND TRADEMARK OFFICE
CERTIFICATE OF CORRECTION

PATENT NO. : 7,332,970 B2 Page 1 of 1
APPLICATION NO. : 11/080341
DATED : February 19, 2008
INVENTOR(S) : Christoph Kienmayer and Marc Tiebout It is certified that error appears in the above-identified patent and that said Letters Patent is hereby corrected as shown below:

Column 6, line 35, delete "eight" and insert in place thereof --eighth--.

Column 11, line 55, delete "eight" and insert in place thereof --eighth--.

Signed and Sealed this

Thirtieth Day of December, 2008

JON W. DUDAS
*Director of the United States Patent and Trademark Office*